United States Patent
Curch

(10) Patent No.: US 7,807,555 B2
(45) Date of Patent: Oct. 5, 2010

(54) METHOD OF FORMING THE NDMOS DEVICE BODY WITH THE REDUCED NUMBER OF MASKS

(75) Inventor: Michael Curch, Sebastian, FL (US)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 11/870,794

(22) Filed: Oct. 11, 2007

(65) Prior Publication Data

US 2009/0035910 A1    Feb. 5, 2009

Related U.S. Application Data

(60) Provisional application No. 60/952,956, filed on Jul. 31, 2007.

(51) Int. Cl.
H01L 21/38 (2006.01)
(52) U.S. Cl. ............... 438/546; 438/377; 257/E21.135; 257/E21.158; 257/E21.211; 257/E21.466
(58) Field of Classification Search ............... 438/377, 438/546
See application file for complete search history.

(56) References Cited

U.S. PATENT DOCUMENTS

| | | | | |
|---|---|---|---|---|
| 3,793,721 A | * | 2/1974 | Wakefield et al. | 438/279 |
| 3,852,127 A | * | 12/1974 | Lamming | 438/372 |
| 3,921,283 A | * | 11/1975 | Shappir | 438/227 |
| 4,089,712 A | * | 5/1978 | Joy et al. | 438/286 |
| 4,181,542 A | * | 1/1980 | Yoshida et al. | 438/193 |
| 4,859,615 A | * | 8/1989 | Tsukamoto et al. | 438/247 |
| 4,868,619 A | * | 9/1989 | Mukherjee et al. | 257/300 |
| 5,075,242 A | * | 12/1991 | Nakahara | 438/217 |
| 5,095,358 A | * | 3/1992 | Aronowitz et al. | 257/616 |
| 5,262,345 A | * | 11/1993 | Nasser et al. | 438/203 |
| 5,304,827 A | * | 4/1994 | Malhi et al. | 257/262 |
| 5,382,535 A | * | 1/1995 | Malhi et al. | 438/194 |
| 5,684,319 A | * | 11/1997 | Hebert | 257/336 |
| 5,700,717 A | * | 12/1997 | Nowak et al. | 438/629 |
| 5,726,477 A | * | 3/1998 | Williams et al. | 257/402 |
| 5,739,061 A | * | 4/1998 | Kitamura et al. | 438/275 |
| 5,793,064 A | * | 8/1998 | Li | 257/119 |
| 5,875,129 A | * | 2/1999 | Atsumi et al. | 365/185.27 |
| 5,882,974 A | * | 3/1999 | Gardner et al. | 438/286 |
| 5,970,347 A | * | 10/1999 | Gardner et al. | 438/286 |
| 5,972,745 A | * | 10/1999 | Kalter et al. | 438/220 |
| 6,048,770 A | * | 4/2000 | Sakakibara | 438/291 |
| 6,063,674 A | * | 5/2000 | Yang et al. | 438/286 |
| 6,117,738 A | * | 9/2000 | Tung | 438/286 |

(Continued)

*Primary Examiner*—Fernando L Toledo
*Assistant Examiner*—Ankush k Singal
(74) *Attorney, Agent, or Firm*—Barnes & Thornburg LLP

(57) ABSTRACT

This disclosure describes an improved process and resulting structure that allows a single masking step to be used to define both the body and the threshold adjustment layer of the body. The method consists of forming a first mask on a surface of a substrate with an opening exposing a first region of the substrate; implanting through the opening a first impurity of a first conductivity type and having a first diffusion coefficient; and implanting through the opening a second impurity of the first conductivity type and having a second diffusion coefficient lower than the first diffusion coefficient. The first and second impurities are then co-diffused to form a body region of a field effect transistor. The remainder of the device is formed.

9 Claims, 3 Drawing Sheets

U.S. PATENT DOCUMENTS

| | | | |
|---|---|---|---|
| 6,242,787 B1 * | 6/2001 | Nakayama et al. | 257/493 |
| 6,350,640 B1 * | 2/2002 | Fuller et al. | 438/202 |
| 6,423,589 B2 * | 7/2002 | Park et al. | 438/231 |
| 6,586,296 B1 * | 7/2003 | Watt | 438/224 |
| 6,677,212 B1 * | 1/2004 | Yoshioka et al. | 438/303 |
| 6,707,101 B2 * | 3/2004 | Ranjan | 257/339 |
| 6,713,814 B1 * | 3/2004 | Koscielniak | 257/330 |
| 6,777,293 B1 * | 8/2004 | Koscielniak | 438/259 |
| 6,777,748 B1 * | 8/2004 | Plikat et al. | 257/343 |
| 6,797,577 B2 * | 9/2004 | Johnson et al. | 438/309 |
| 6,803,282 B2 * | 10/2004 | Mitros et al. | 438/275 |
| 6,806,160 B2 * | 10/2004 | Ker et al. | 438/371 |
| 6,830,978 B2 * | 12/2004 | Ariyoshi et al. | 438/299 |
| 6,888,205 B2 * | 5/2005 | Moscatelli et al. | 257/406 |
| 6,933,560 B2 * | 8/2005 | Lee et al. | 257/328 |
| 6,953,968 B2 * | 10/2005 | Nakamura et al. | 257/328 |
| 6,960,511 B2 * | 11/2005 | Ito et al. | 438/289 |
| 7,056,797 B2 * | 6/2006 | Kikuchi et al. | 438/301 |
| 7,098,509 B2 * | 8/2006 | Zdebel et al. | 257/355 |
| 7,145,206 B2 * | 12/2006 | Mallikarjunaswamy | 257/370 |
| 7,161,210 B2 * | 1/2007 | Nishibe et al. | 257/344 |
| 7,245,243 B2 * | 7/2007 | Takimoto et al. | 341/112 |
| 7,297,582 B2 * | 11/2007 | Abadeer et al. | 438/197 |
| 7,312,484 B1 * | 12/2007 | Drowley et al. | 257/187 |
| 2002/0050618 A1 * | 5/2002 | Nishibe et al. | 257/368 |
| 2002/0063266 A1 * | 5/2002 | Lee | 257/200 |
| 2002/0132435 A1 * | 9/2002 | Zampardi et al. | 438/312 |
| 2002/0158312 A1 * | 10/2002 | Beasom | 257/593 |
| 2003/0109089 A1 * | 6/2003 | Mitros et al. | 438/197 |
| 2004/0056283 A1 * | 3/2004 | Yamauchi et al. | 257/219 |
| 2004/0132260 A1 * | 7/2004 | Lenoble | 438/306 |
| 2004/0164304 A1 * | 8/2004 | Magri et al. | 257/73 |
| 2004/0262680 A1 * | 12/2004 | Ehwald et al. | 257/335 |
| 2005/0029582 A1 * | 2/2005 | Mallikarjunaswamy | 257/328 |
| 2005/0244668 A1 * | 11/2005 | Narita et al. | 428/610 |
| 2006/0157781 A1 * | 7/2006 | Takimoto et al. | 257/335 |
| 2007/0148888 A1 * | 6/2007 | Krull et al. | 438/306 |
| 2007/0148892 A1 * | 6/2007 | Otake et al. | 438/365 |
| 2007/0207621 A1 * | 9/2007 | Guenther | 438/733 |

* cited by examiner

METHOD OF FORMING THE NDMOS DEVICE BODY WITH THE REDUCED NUMBER OF MASKS

BACKGROUND AND SUMMARY OF THE DISCLOSURE

The present disclosure relates generally to integrated circuits and, more specifically, to improved insulated gate field effect transistors (IGFET) in the integrated circuit.

Many of IGFET structures use a body diffusion in which the source but not the drain contact is located. The body's surface doping is one of the structure parameters that sets the threshold voltage of the device. A junction between the relatively high doped body and a lighter doped adjoining region allows a depletion layer width sufficient to support the desired voltage to expand in the lightly doped region while the high doped body prevents punch through across the body surface to a source located near to the surface intersection of the junction. This allows a short channel length.

The body layer of these devices often requires a graded profile that defines the junction with a depth on the order of or greater than 1 micron. This layer together with the region in which it is formed has a large impact on the breakdown voltage. It also controls the channel length in self aligned body structures. The surface of the body layer often requires a region of higher doping to set the threshold voltage.

In the prior art, the body has been formed by a masked implantation and diffusion. The threshold voltage setting layer has been formed by a second masked implant formed after the body diffusion. Boron has been used to form both layers in these devices. This method is illustrated in FIGS. 1A-1D. Also, indium has been used as a threshold adjustment in $\leq 0.18$ μm CMOS processes. Indium has not been used in a lateral NDMOS application where the P type body sees significant diffusion in order to achieve the higher voltage requirement.

This disclosure describes an improved process and resulting structure that allows a single masking step to be used to define both the body and the threshold adjustment layer of the body. The method consists of forming a first mask on a surface of a substrate with an opening exposing a first region of the substrate; implanting through the opening a first impurity of a first conductivity type and having a first diffusion coefficient; and implanting through the same opening a second impurity of the first conductivity type and having a second diffusion coefficient lower than the first diffusion coefficient. The first and second impurities are then co-diffused to form a body region of a field effect transistor. The remainder of the device is formed.

The second diffusion coefficient is less than half of the first diffusion coefficient. The first impurity may be boron and the second impurity may be indium. The first impurity may include implanting the first impurity twice at more than one or at least two different energy levels. The first region may be of the second conductivity type and is the drain region. Alternatively, the first region may be of the first conductivity type and the drain region of the second conductivity type is formed in the surface of the substrate adjacent the body region.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1A:
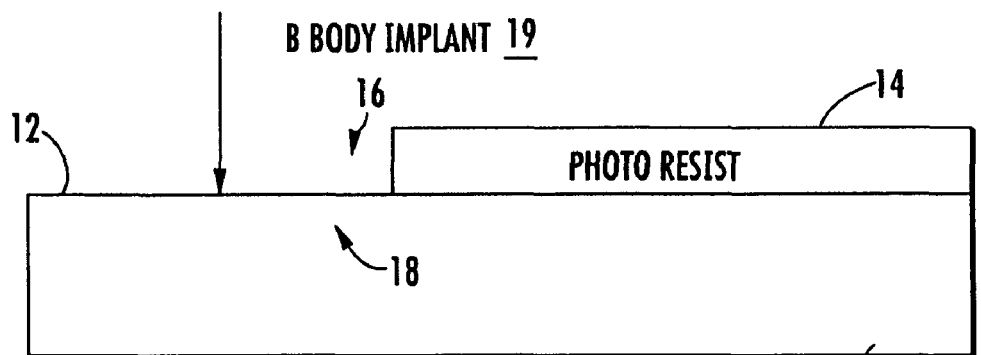
FIGS. 1A-1D are cross-sectional views of an integrated circuit at different stages of fabricating the body of an IGFET according to the prior art.
Figure 1B:
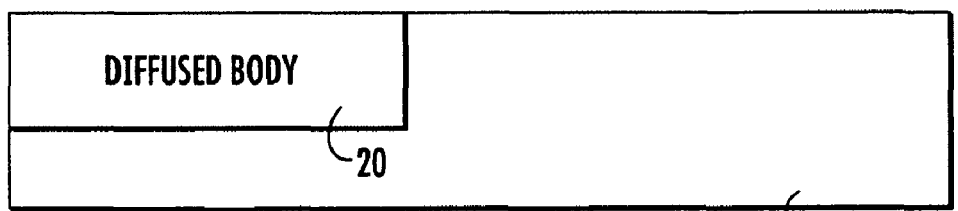
Figure 1C:
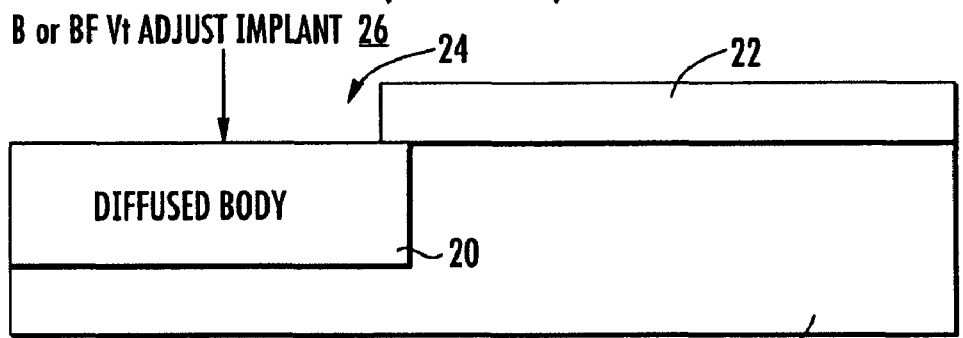
Figure 1D:
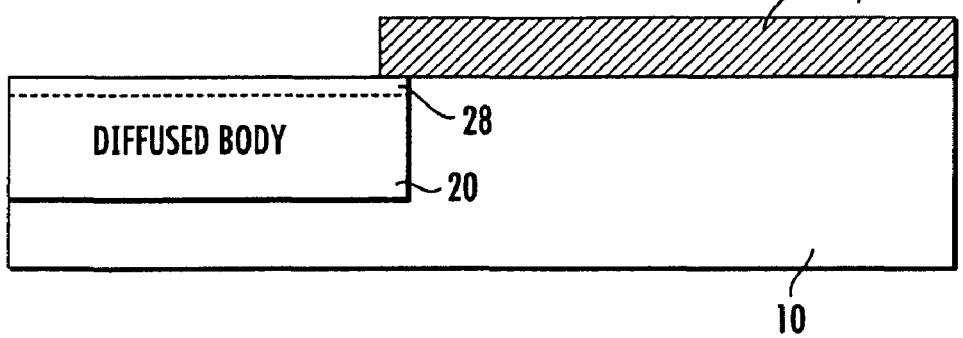

The method of forming the body region of a IGFET device of the prior art is illustrated in FIGS. 1A through 1D. A substrate 10 is processed by forming a photo resist mask 14 on the surface 12 having an opening 16 exposing a region 18 of the substrate 10. This structure is illustrated in FIG. 1A. Boron 19 is then implanted through the opening 16 of the mask into region 18. Photo resist material 14 is removed and the boron is then diffused to form a diffused body region 20 as illustrated in FIG. 1B. A second photo resist material 22 is applied and delineated to form a mask having an opening 24 exposing the diffused body 20. The structure is illustrated in FIG. 1C. Boron or $BF_2$ 26 is implanted to adjust the voltage threshold of and into the body 20 through the mask opening 24. This produces the increased the impurity region 28 in the surface of the diffused body 20, as a result of the heating steps to produce, for example, a polysilicon gate 30 over a gate oxide 32.

As a typical example, the first boron implant 19 may be implanted at 30 KeV. Typically a second boron implant is at 150 KeV through the same opening 16 prior to diffusion. The diffusion process can be at 950° C. for an oxidation and annealing at approximately 90 minutes plus ramping. The threshold adjustment at implant 26 may be BF2 implanted at an energy of 50 KeV.

Figure 2A:
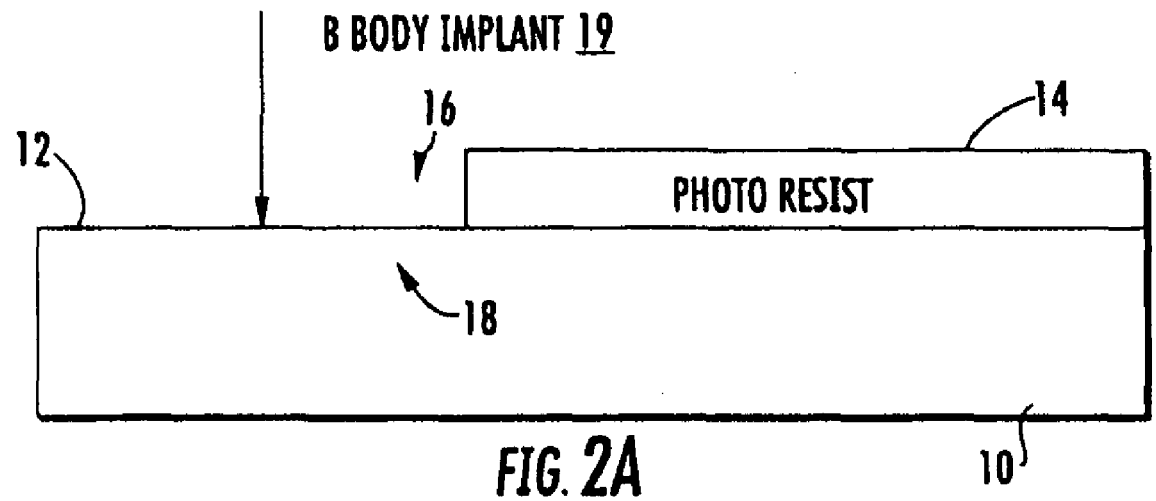
FIGS. 2A-2C are cross-sectional views of an integrated circuit at different stages of fabricating the body of an IGFET according to a first embodiment of the present disclosure.
Figure 2B:
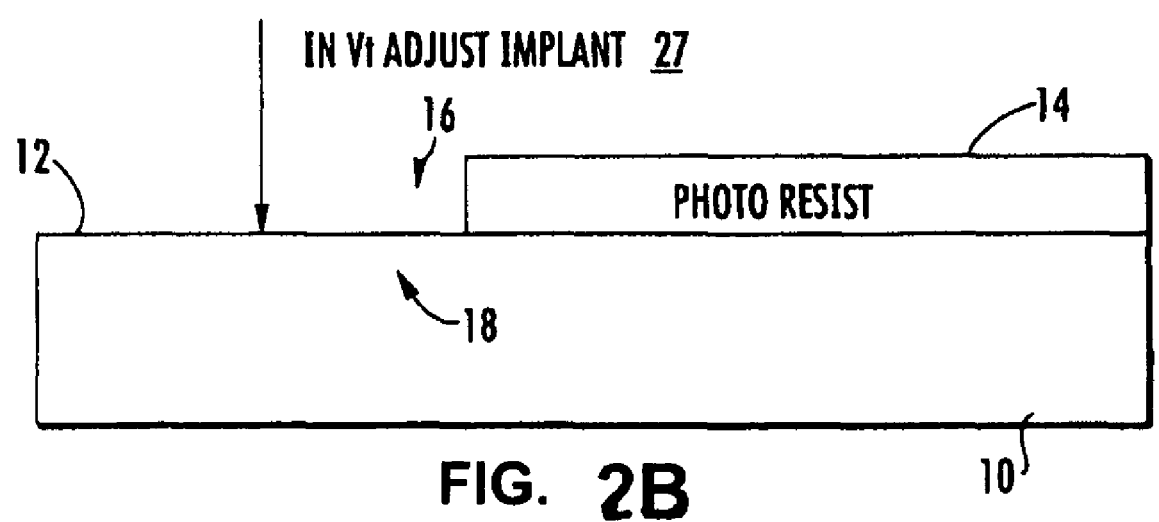
Figure 2C:
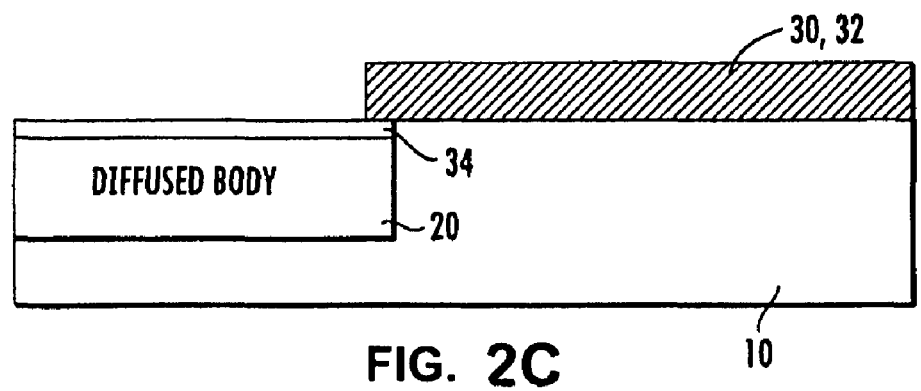

The present process illustrated in FIGS. 2A-2C uses a single mask and a single diffusion process to form the diffused body plus the threshold adjustment. As illustrated in FIGS. 2A-2B, the mask 14 on surface 12 of the substrate 10 provides an opening 16 exposing the region 18. At least two different impurities of the same conductivity type but different diffusion coefficients are implanted through the mask opening 16 into region 18. As an example, the first impurity 19 (as illustrated in FIG. 2A) is boron and the second impurity 27 (as illustrated in FIG. 2B) is indium. For a PDMOS, the impurities may be phosphorus and one of arsenic and antimony. The resulting structures after diffusion is illustrated in FIG. 2C wherein the boron body portion is 20 and the indium adjusted surface portion of the body is 34. The polycrystalline in gate 30 and the gate oxide 32 are also illustrated.

Using the parameters described in respect to FIG. 1, the boron implant 19 is approximately the same as that in FIG. 1 and may be two boron implants of 30 Kev and 150 KeV. The indium implant is low energy implant at for example, 70 KeV. The diffusion of the two or three implants is at the same 950° C. to perform the oxidation and annealing for a time period of 90 minutes including ramps.

The method depends on the fact that the diffusion coefficient of indium is only about 25% of the boron diffusion coefficient at the same temperature. As a result, the indium remains near the surface as required for the threshold setting layer while the boron body diffuses to the required depth. These are just two examples of impurities of the same conductivity type and different coefficients of diffusion. The second diffusion coefficient should be less than half of the first diffusion coefficient.

The use of indium as a P type dopant in silicon has generally been avoided because its location at about 156 meV from the valance band edge leads to significant freeze out at normal circuit operation temperature. There has been some suggestion of the use of indium under specialized conditions such as in the paper "Re-examination of Indium implantation for a low power 0.1 μm technology" by P. Bouillon et. al. pp. 897-900 in the 1995 IEDM Technical Digest. The application described there is for a 0.1 μm NMOS channel. The paper does not describe the requirements of a high voltage asymmetric lateral NMOS nor does it describe forming body and threshold setting layers with a single masking step and diffusing them together. Also, indium has been uses as a threshold adjustment in 0.18 μm CMOS process. Indium has not been used in a lateral NDMOS application where the P type body sees significant diffusion in order to achieve the higher voltage requirement.

Figure 3:
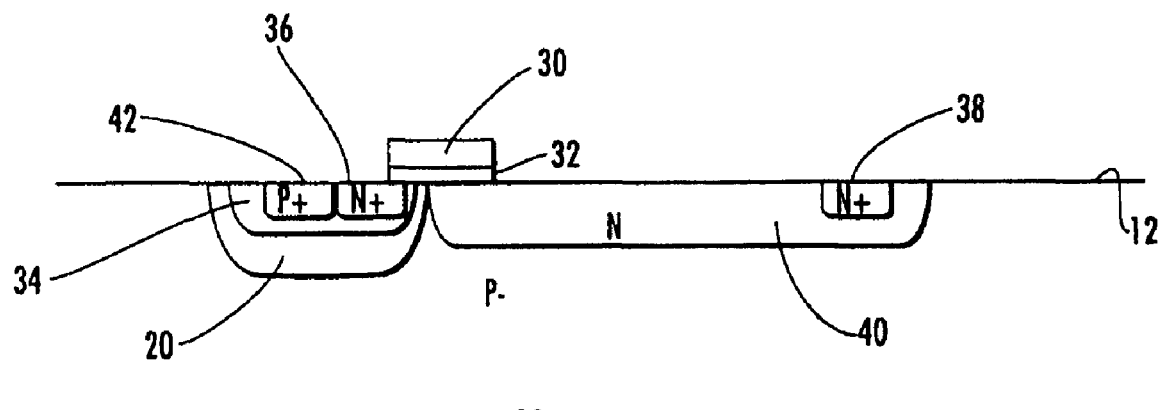
FIG. 3 is a cross-sectional view of an integrated circuit an example of an IGFET incorporating the source fabricated in FIG. 2.

The method is considered to be applicable, for example, to the realization of a 24 volts breakdown voltage extended drain NMOS implemented in a 0.25 micron CMOS process such as that illustrated in FIG. 3. The concept can be used to realize breakdown voltages up to at least 80 volts. Depending on the epitaxial thickness of the process, higher breakdown voltages may be achieved.

Substrate 10 is illustrated as a P– body which includes the boron body portion 20 therein and the indium portion 34 in the body portion 20. An N+ source region 36 is formed in the indium portion 34. Depending on how much of the surface of the body portion 20 the indium portion 34 occupies, the source contact region 36 may extend out of indium portion 34 and into the body portion 20. An N+ drain contact 38 is formed in a drain extension 40. The drain extension 40 is in the surface 12 of the substrate 10 and abuts the boron body portion 20. The gate 30 and the oxide 32 extends from the source region 36 across the bodies portions 20 and 34 and onto the extended drain region 40. The optional P+ body contact 42 is formed in the indium layer 34.

As previously noted for the source region 36, the body contact 42 may extend out of indium portion 34 and into the body portion 20. The device illustrated in FIG. 3 is just an example of the type of device that can benefit from the dual structure body portions 20 and 34.

Although the present disclosure had been described and illustrated in detail, it is to be clearly understood that this is done by way of illustration and example only and is not to be taken by way of limitation. The scope of the present disclosure is to be limited only by the terms of the appended claims.

What is claimed is:

1. A method of forming field effect transistors in an integrated circuit which includes forming a dual structure body region of a first conductivity type in a first region of the substrate, forming a source region of a second conductivity type in the surface of the dual structure body region portions, and forming a drain contact region of the second conductivity type in the surface of a drain region in the substrate, the method of forming the dual structure body region portions comprising:
   forming a first mask on the surface of the substrate with an opening exposing the first region of the substrate;
   implanting through the opening a first impurity of the first conductivity type and having a first diffusion coefficient;
   implanting through the same opening a second impurity of the first conductivity type and having a second diffusion coefficient lower than the first diffusion coefficient; and
   co-diffusing the first and second impurities to form the dual structure body region portions of a field effect transistor, wherein the resulting dual structure body region portions are further processed to form the source region and the drain region.

2. The method according to claim 1, wherein the second diffusion coefficient is less than half of the first diffusion coefficient.

3. The method according to claim 1, wherein the first impurity is phosphorus and the second impurity is one of arsenic and antimony.

4. The method according to claim 1, wherein the first impurity is boron and the second impurity is indium.

5. The method according to claim 1, wherein implanting the first impurity includes implanting the first impurity twice at two different energy levels.

6. The method according to claim 1, wherein the first region is of the second conductivity type and is the drain region.

7. The method according to claim 1, wherein the first region is of the first conductivity type and the method further includes forming the drain region of the second conductivity type in the surface of the substrate adjacent the body region.

8. The method according to claim 1, further comprising forming the source region of the second conductivity type in the surface of the dual structure body portions.

9. A method of forming field effect transistors in an integrated circuit which includes forming a dual structure body region of a first conductivity type in a first region of the substrate, forming a source region of a second conductivity type in the surface of the dual structure body region portions, and forming a drain contact region of the second conductivity type in the surface of a drain region in the substrate, the method of forming the dual structure body region portions comprising:
   forming a first mask on the surface of the substrate with an opening exposing the first region of the substrate;
   implanting through the opening a first impurity of the first conductivity type and having a first diffusion coefficient;
   implanting through the same opening a second impurity of the first conductivity type and having a second diffusion coefficient different than the first diffusion coefficient, prior to diffusing the first impurity; and
   co-diffusing the first and second impurities to form the dual structure body region portions of a field effect transistor, wherein the resulting dual structure body region portions are further processed to form the source region and the drain region in the dual structure body region of the field effect transistor.

* * * * *

UNITED STATES PATENT AND TRADEMARK OFFICE
CERTIFICATE OF CORRECTION

Page 1 of 1

PATENT NO. : 7,807,555 B2
APPLICATION NO. : 11/870794
DATED : October 5, 2010
INVENTOR(S) : Michael Church It is certified that error appears in the above-identified patent and that said Letters Patent is hereby corrected as shown below:

Title page, item (75) Inventor: replace "Michael Curch" with --Michael Church--.

Signed and Sealed this
Thirty-first Day of May, 2011

David J. Kappos
*Director of the United States Patent and Trademark Office*